(12) United States Patent
Norling et al.

(10) Patent No.: US 10,601,415 B2
(45) Date of Patent: Mar. 24, 2020

(54) CONFIGURABLE INTEGRATED DESATURATION FILTER

(71) Applicant: Infineon Technologies Austria AG, Villach (AT)

(72) Inventors: Karl Norling, Villach (AT); Erwin Huber, Munich (DE)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

(21) Appl. No.: 16/008,624

(22) Filed: Jun. 14, 2018

(65) Prior Publication Data

US 2019/0386654 A1    Dec. 19, 2019

(51) Int. Cl.
*H03K 17/687* (2006.01)
*H03K 17/16* (2006.01)
*H03K 17/0812* (2006.01)

(52) U.S. Cl.
CPC ..... *H03K 17/168* (2013.01); *H03K 17/08122* (2013.01); *H03K 17/08128* (2013.01); *H03K 17/162* (2013.01)

(58) Field of Classification Search
CPC .......... H03K 17/567; H03K 17/04123; H03K 17/6877; H03K 17/063; H03K 17/6874
USPC ................. 327/109, 427, 432, 434
See application file for complete search history.

(56) References Cited

U.S. PATENT DOCUMENTS

| | | | |
|---|---|---|---|
| 8,984,197 B2 | 3/2015 | Charpentier et al. | |
| 9,621,151 B2 * | 4/2017 | Kanda | H03K 3/356113 |
| 2004/0120090 A1 * | 6/2004 | Galli | H02M 1/32 |
| | | | 361/115 |
| 2013/0242438 A1 * | 9/2013 | Fukuta | H02H 1/0007 |
| | | | 361/18 |
| 2014/0118874 A1 * | 5/2014 | Kandah | H03K 17/0826 |
| | | | 361/93.1 |
| 2018/0102773 A1 * | 4/2018 | Li | H03K 17/18 |
| 2018/0198442 A1 * | 7/2018 | Hokazono | H03K 17/30 |

OTHER PUBLICATIONS

Hemmer, R., et al., "InPower Systems Programmable IGBT Driver," InPower GmbH, Datasheet and Application Manual, 1IPSD70PTW33-60, Dec. 2007, 17 pages.
Kviz, P., et al., "Digital IGBT-Drivers Intelligent Switching—Full Protection," InPower Systems, GmbH, Feb. 2013, 45 pages.
Batheesh, Nitesh et al., "AgileSwitch," AgileSwitch, LLC, 19 pages, Oct. 2016.
Satheeshe, N., et al., "EDEM3-Programmable EconoDual Electrical Series—Optimized for Silicon Carbide (SIC) MOSFET Modules," AgileSwitch, Preliminary, V01, 12 pages, Apr. 2016.

* cited by examiner

*Primary Examiner* — Anh Q Tra
(74) *Attorney, Agent, or Firm* — Slater Matsil, LLP (57) ABSTRACT

A system includes a control circuit having first and second detectors coupled to a first node of the control circuit, first and second filters coupled to the first and second detectors, and a logic circuit coupled to the first and second filters, a diode circuit having a first node coupled to the first node of the control circuit, and a switch having a first current node coupled to a second node of the diode circuit, a gate coupled to a second node of the control circuit, and a second current node coupled to a third node of the control circuit, wherein a first detector is used to provide a first event overcurrent signal and a second detector is used to provide a multiple event overcurrent signal or a warning signal.

22 Claims, 6 Drawing Sheets

CONFIGURABLE INTEGRATED DESATURATION FILTER

TECHNICAL FIELD

The present invention relates generally to a system and method for providing a configurable integrated DESAT (desaturation region) filter for an IGBT or MOSFET.

BACKGROUND

Semiconductor switches such as IGBTs or MOSFETs must be protected against overload conditions due to, for example, an overcurrent condition, otherwise excessive heating and subsequent damage to the switches can occur.

Figure 1A:
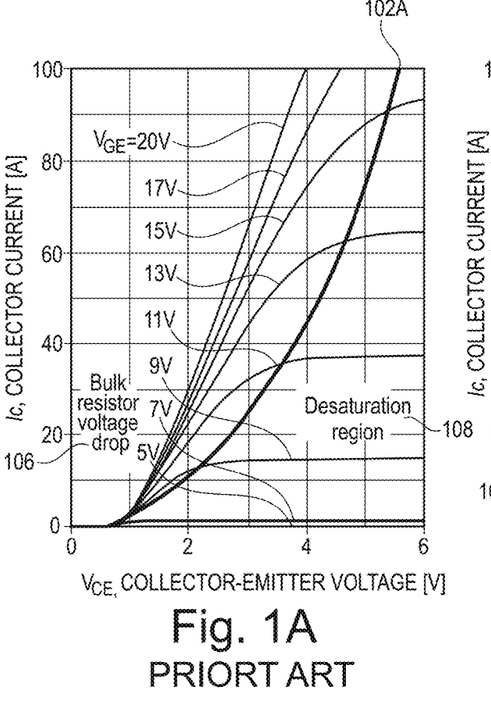
FIGS. 1A and 1B are plots of typical output characteristics of an IGBT switch at first and second operating temperatures.

FIG. 1A is a plot of the typical output characteristics of an IGBT at 25° C., wherein the collector current ($I_C$) is plotted against the collector-emitter-voltage ($V_{CE}$). Curve 102A demarcates a first operating region 106 wherein the switch exhibits a bulk resistor voltage drop, and a second operating region 108 designated the desaturation region.

Figure 1B:
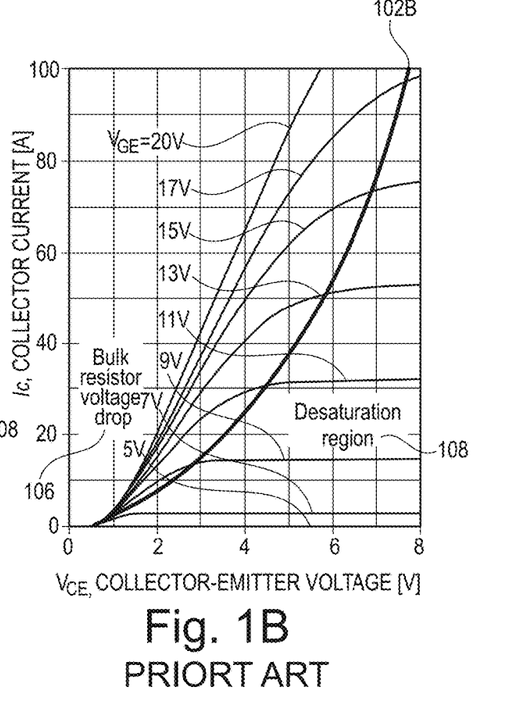

FIG. 1B is a plot of the typical output characteristics of an IGBT at 175° C., wherein the collector current ($I_C$) is plotted against the collector-emitter-voltage ($V_{CE}$). Curve 102B demarcates the first operating region 106 wherein the switch exhibits a bulk resistor voltage drop, and the second operating region 108 designated the desaturation region.

IGBTs react to an overcurrent event with an increase of the collector-emitter-voltage $V_{CE}$. With increased current the $V_{CE}$ voltage is increased according to the bulk resistance multiplied by the collector current. If the collector current is increased further, the IGBT desaturates, and the $V_{CE}$ is increased until the current is limited or until $V_{CE}$ reaches the supply voltage (DC-link voltage).

MOSFETs react to an overcurrent event with an increase of the drain-source-voltage $V_{DS}$ according to the resistive voltage drop across the ON-resistance. With increased current the MOSFET saturates until the current is limited or until $V_{DS}$ reaches the supply voltage (DC-link voltage). For simplicity the following description uses the IGBT wording and model, but the principle is applicable for MOSFETs as well. The $V_{CE}$ voltage is measured in the IGBT conduction state via a high voltage blocking element. In the IGBT blocking state the high voltage blocking element decouples the sensing input from the high IGBT blocking voltage. Therefore the voltage VCE is measured in a voltage range up to approximately six to nine volts directly. Higher voltages are only detected as "high" and can lead to a desaturation event. A DESAT event is a major failure for an application, which typically requires a time consuming restart. Therefore false detection should be prevented as well as a false "no detection" of a DESAT event, which may lead to a destruction of the switch. In addition, the driver is frequently placed in a noisy environment. This leads to the need to filter the DESAT input against noise, spikes and other disturbances. This, in turn, leads to limitations on how fast the DESAT detection can occur. Due to this limitation in speed, recurring shorts for shorter duration ON pulses cannot be detected. If this condition continues for many consecutive pulses it might lead to a successive rise in temperature of the switch and eventual damage.

SUMMARY

In accordance with an embodiment of the present invention, a system comprises a control circuit having a plurality of detectors coupled to a first node of the control circuit, a plurality of filters coupled to the plurality of detectors, and a logic circuit coupled to the first and second filters, a diode circuit having a first node coupled to the first node of the control circuit, and a switch having a first current node coupled to a second node of the diode circuit, a gate coupled to a second node of the control circuit, and a second current node coupled to a third node of the control circuit wherein a first detector of the plurality of detectors is configured to provide a first event overcurrent signal and at least a second detector of the plurality of detectors is configured to provide a multiple event overcurrent signal or a warning signal. The first detector has a first detection threshold, and the second detector has a second detection threshold equal to or different from the first detection threshold. The first filter has a first time constant, and the second filter has a second time constant equal to or different from the first time constant. A clamping transistor is coupled between the first and third nodes of the control circuit. The diode circuit comprises a resistor and diode coupled in series. The second detector can be configured to provide margin testing of a performance criterion of the first detector. The first and second detectors can be configured to provide an overcurrent signal or a warning signal during a two-level turnoff plateau operating mode of the system.

In accordance with another embodiment of the present invention, a circuit comprises a plurality of detectors coupled to a first node, wherein a first detector of the plurality of detectors has a first programmable detection threshold, and a second detector of the plurality of detectors has a second programmable detection threshold equal to or different from the first detection threshold, a plurality of filters coupled to the plurality of detectors, wherein a first filter of the plurality of filters has a first programmable time constant, and a second filter of the plurality of filters has a second programmable time constant equal to or different from the first time constant, and a logic circuit having an input coupled to the plurality of filters and an output coupled to a second node coupled to a switch, wherein the first detector of the plurality of detectors is configured to provide a first event overcurrent signal and at least the second detector of the plurality of detectors is configured to provide a multiple event overcurrent signal or a warning signal. At least one of the first and second detectors comprise a comparator coupled to a DAC, or an ADC. The first and second filters can comprise different filter types.

In accordance with another embodiment of the present invention, a method comprises detecting an input signal using a first threshold to generate a first detected signal, detecting the input signal using a second threshold to generate a second detected signal, filtering the first detected signal using a first time constant to generate a first filtered signal, filtering the second detected signal using a second time constant to generate a second filtered signal, using the first filtered signal to generate a first event overcurrent signal, and using at least the second filtered signal to generate either a multiple event overcurrent signal or a warning signal. The method further comprises controlling an operating mode of a switch using the overcurrent signal. The method further comprises counting a plurality of overcurrent events associated with the input signal before generating the multiple event overcurrent signal or the warning signal. Filtering the first detected signal comprises filtering the first detected signal with a first filtering method, and filtering the second detected signal comprises filtering the second detected signal with a second filtering method. The method is performed in a switching system, and includes counting a plurality of overcurrent events associated with the input signal to enable margin testing of at least one performance criterion of the switching system. The multiple event overcurrent signal or warning signal can be generated during a two-level turn-off plateau operating mode of the switching system. The method can further include detecting the input signal using a plurality of thresholds to generate a plurality of detected signals, and filtering the plurality of detected signals using a plurality of time constants to generate a plurality of filtered signals. At least one of the first threshold, second threshold, first time constant, and second time constant are programmable.

The use of at least one additional DESAT detector according to an embodiment of the invention allows for additional modes of operation for controlling a switch during one or more overcurrent events. An additional DESAT detector with a lower detection threshold and filter time as other parallel DESAT detectors can be used as a margin indicator for assessing system performance rather than a protection element. The use of an additional DESAT detector can also be used to detect shorter short-circuit events and where the number of detected shorter short-circuit events over several PWM cycles can be counted to determine if the turn-on operation of the driven switch should be prevented. The use of an additional DESAT detector can be used during a two-level turn-off plateau to generate an overcurrent signal or warning signal.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Several different types of DESAT detection and filtering circuits and implementations are described below that are suitable for use with an embodiment of the configurable integrated desaturation filter of the invention.

Figure 2:
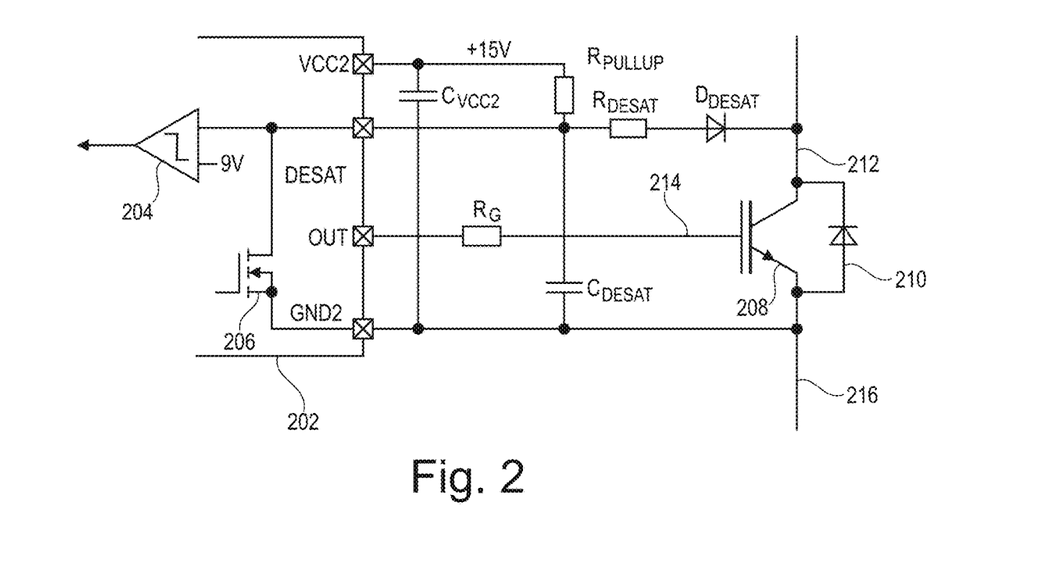
FIGS. 2-4 are circuit diagrams of DESAT detection and filtering implementations for use with an IGBT switch that are suitable for use with an embodiment of the configurable integrated desaturation filter of the invention.
Figure 3:
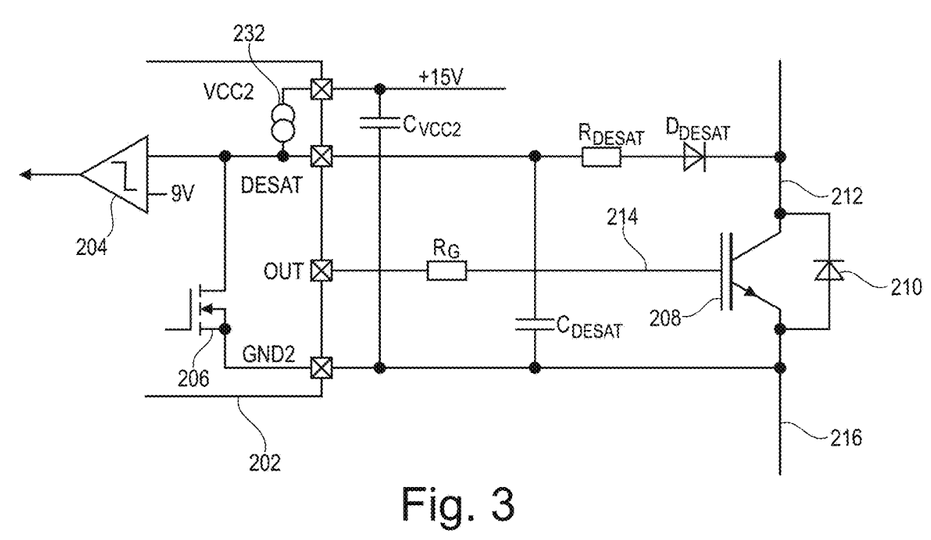

The circuits of FIGS. 2 and 3 use a high voltage diode as blocking element. The VCE voltage is measured in the IGBT conduction state (ON state) via a high voltage blocking diode biased by a current. Therefore the voltage VCE plus the forward voltage of the diode is measured in a voltage range. The threshold voltage for detection is approximately six to nine volts for an IGBT switch and approximately two volts to nine volts for a MOSFET switch. Higher voltages are an indication of a desaturation event. A comparator detects this and reports the event. In the OFF state the high voltage blocking diode decouples the sensing input from the high IGBT blocking voltage at the collector.

The filtering of the DESAT input can be realized with a small capacitor. The time constant of the filter determines the time it takes to charge the capacitance at the DESAT pin to a comparator voltage trigger level (defined herein as "filter time"). Due to this, the filter time is impacted by the variation of the current that charge the capacitance, the variation of the value of the capacitance, the variation of the comparator trip level and the pre-charged voltage level the capacitance has at the point in time when the short circuit of the switch happens. The pre-charged voltage level depends on the loading of the switch and if the current is positive or negative through the switch (or diode for the IGBT).

The charging current can be implemented as a simple pull up resistor (see FIG. 2), which results in a flat charging curve at the detection threshold due to the RC filtering nature. Therefore this solution has a high sensitivity to noise around the trip point and high sensitivity for the filter time variation due to comparator detection level variations. Low spread resistances are inexpensive, but the charging current and the filter time are sensitive to supply voltage variation. However, the charging current dependent losses are dissipated in the resistor.

FIG. 2 shows a control circuit 202 including $V_{CC2}$, DESAT, OUT, and GND2 pins. Control circuit also includes a comparator 204 for monitoring the voltage on the DESAT pin, and a clamping transistor 206 coupled between the DESAT and GND2 pins for clamping the DESAT pin to the GND2 pin voltage. At turn on of switch 208 the clamp transistor 206 may be released at the same time or be released at a determined time after the turn on of switch 208. At turn off of switch 208 the clamp transistor 206 is activated at the same time as the turn off command. The command signals for a turn off of switch 208 come at the same time as the activation command for clamp 206. In some embodiments, the turn off of switch 208 is artificially delayed. FIG. 2 also includes a filter capacitor $CV_{CC2}$ coupled between the $V_{CC2}$ pin and the GND2 pin, a gate resistor RG coupled between the OUT pin and the gate 214 of IGBT 208. IGBT 208 is also coupled to a recirculation diode 210 at collector node 212 and emitter node 216. The pullup resistor $R_{PULLUP}$ is coupled between the $V_{CC2}$ pin and the DESAT pin. A DESAT resistor $R_{DESAT}$ and a DESAT diode $D_{DESAT}$ are coupled between the DESAT pin and the collector 212 of IGBT 208.

The charging current can also be implemented as an integrated current source (see FIG. 3). The filter time constant depends on the accuracy of the current source. A constant voltage ramp makes the dv/dt of the voltage ramp steeper around the comparator trip point compared to the exponential charging in the resistor case described above. Ramp-up and settling time of the current source introduces a potential error to the filter time if it needs to be used directly after the activation of the power switch. Robustness of the current source against voltages at the DESAT pin above driver supply and below emitter potentials is required, which can cause latch up or other disturbances of the operation of the circuit.

FIG. 3 includes substantially the same components as those described above with respect to the circuit of FIG. 2, except for the addition of the integrated current source 232 coupled between the VCC2 and DESAT pins.

The capacitance at the DESAT pin includes the discrete capacitor CDESAT and the charge on the high voltage diode DDESAT. Due to the limited charging current in the current source circuit of FIG. 3 (up to few hundred µA) and the small filter time (up to a few µs) the DESAT filter capacitor CDESAT has to be small, typically in the range of 50 pF to 250 pF. The accuracy of the capacitance (and the filter) is influenced by layout capacitance, environmental effects like bedewing, charge variation of the high voltage diode charge of possibly used protection diodes, and leakage currents of possibly used protection diodes.

Figure 4:
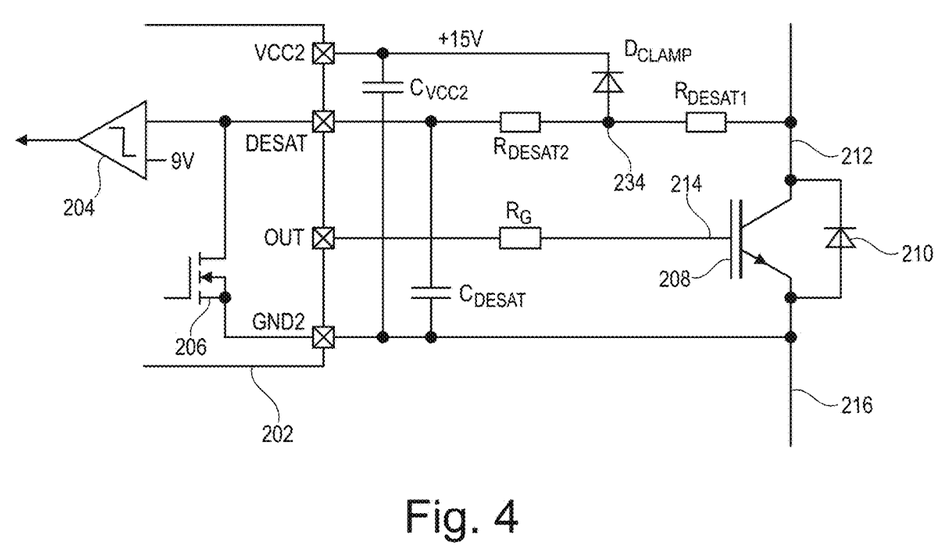

An alternative detection and filtering method uses a voltage divider and clamping diode in order not to use a high voltage diode, as can be seen in the schematic of FIG. 4. FIG. 4 includes substantially the same components as those described above with reference to the circuits of FIGS. 2 and 3, except for the use a clamping diode DCLAMIP, and two separate DESAT resistors RDESAT1 and RDESAT2. Resistors RDESAT1 and RDESAT2 are coupled between the DESAT pin and the collector 212 of IGBT 208. Diode DCLAMP is coupled between the VCC2 pin and the intermediate node 234.

When IGBT 208 is in the off state the clamp transistor 206 is activated to clamp the input of the comparator 204 to 0V. At the same time, the VCE voltage of the IGBT 208 can either be a few volts negative or at a high voltage potential, for example 800V, depending on the load current direction. Depending on the ratio between the resistors RDESAT1 and RDESAT2 and the VCE voltage the diode DCLAMVP will be forward biased or reverse biased. The resistance needs to be high in order not to consume too much power in the resistors in the off state. When the IGBT 208 is turned on the VCE voltage goes down to a VCE,SAT voltage. At the same time or shortly thereafter the clamp transistor releases the clamping of the comparator input (DESAT pin). The filter time is defined by the series resistance of RDESAT1 and RDESAT2, the capacitance at the DESAT pin including any deliberately placed capacitance CDESAT and any additional parasitic capacitance (from the comparator input, the printed circuit board, etc.), the comparator trip level, and the precharged voltage level depending on the loading of the switch. Due to the high resistance in series from the collector to the comparator input, the total capacitance at the DESAT pin has to be very low and therefore any variations of the parasitic capacitances will have a high impact on the total capacitance.

If a desaturation event happens the VCE voltage will increase to a level higher than the threshold of the comparator 204 and the comparator will trigger and turn off the IGBT 208. But the VCE voltage can also become so high during the desaturation event that the voltage becomes higher than the power supply of the gate driver (VCC2). In this case the diode DCLAMP and resistor RDESAT1 will protect the driver form the potentially destructive voltage level at the collector 212 of IGBT 208. The diode DCLAMP clamps node 234 between resistor RDESAT2 and RDESAT1 to a voltage of VCC2+Vth of the diode, and a current will flow from the collector 212 through resistor RDESAT1 and through the diode DCLAMP to the power supply VCC2.

Due to this resistive nature, a resistance can be placed in parallel to capacitor CDESAT in order to create a resistor divider together with the RDESAT1 and RDESAT2. In this manner VCE DESAT levels placed higher than the VCC2 level can be used. This can be of importance if the DESAT detection is to be used for switches able to block voltages higher than, for example, 1700 V.

For each of the filter methods described above, the absolute size of the DESAT capacitance limits the performance of filtering against spikes or coupling from a noisy environment. Additionally filtering at one input with one capacitor gives exactly one time constant. Higher level filtering or parallel detection of a different threshold or filter time combination with one blocking structure (high voltage blocking diode or resistive) is not possible. Additionally the number of different components and configurations that impact the actual filter time results in a great deal of variation in the filter time.

In order to improve filter variation (the filter time independent from the loading of the switch just before the short circuit occurs) according to an embodiment of the invention, two or more independent DESAT levels and filter values are used at the same time sharing the same blocking structure. In an embodiment, the filters can be coupled to the comparator outputs, which are in turn coupled to a logic circuit.

Figure 5A:
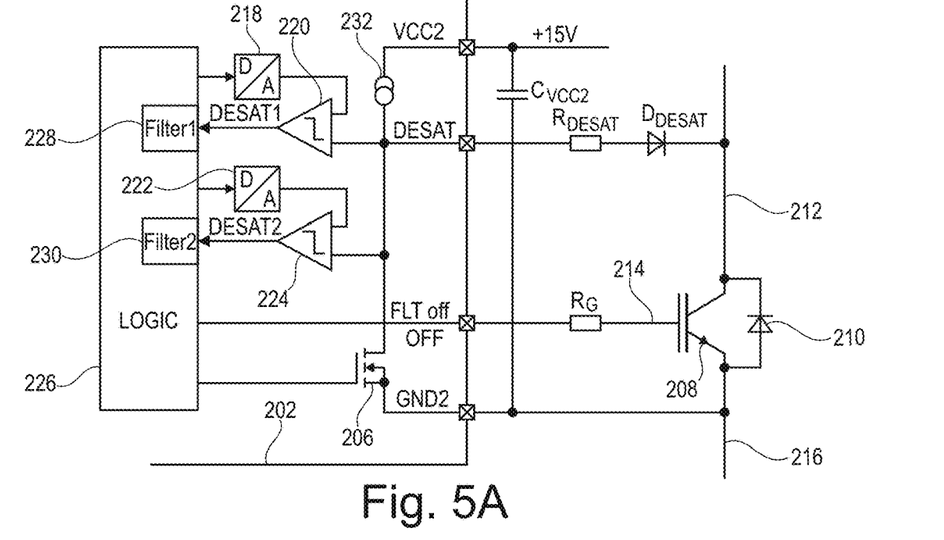
FIGS. 5A and 5B are circuit diagrams of DESAT detection and filtering implementations for use with an IGBT switch according to an embodiment of the invention.

According to an embodiment of the invention, a DESAT detection structure or circuit with one or more independently configurable voltage threshold levels and filter times is used to detect various short circuit and overcurrent events and to provide various signals in response as described herein using only one pin, one resistor and one diode to decouple a DESAT pin from the collector or drain potential of the driven switch in the off state. For low voltage applications a desaturation detection can be done without the use of a diode. In FIG. 5A a circuit according to an embodiment of the invention is shown where the filter is located after the comparator and the reference for (in this case two) comparators is set by a DAC.

FIG. 5A thus shows a controller circuit 202 including the VCC2, DESAT, OFF and GND2 pins, filter capacitor CVCC2, gate resistor RG, DESAT resistor RDESAT, DESAT diode DDESAT, clamping transistor 206, integrated current source 232, and IGBT 208/recirculation diode 210 as previously shown with respect to the circuits shown in FIGS. 2-4. In addition, the circuit of FIG. 5A includes a logic circuit 226 including first and second filters 228 and 230, first and second comparators 220 and 224, and first and second DACs 218 and 222. Note that an input of both comparators 220 and 224 are coupled to the DESAT pin. DAC 218 provides the threshold voltage for comparator 220, and DAC 222 provides the threshold voltage for comparator 224. The output of comparator 220 is coupled to the first filter 228, and the output of comparator 224 is coupled to the second filter 230.

Having two or more differently configured DESAT detectors with different DESAT filter time/voltage threshold settings the level of protection against over load failures in the application is increased. The driver can be set up to cover a wider range of DESAT detection cases and increase the detection range from only short circuit protection to overcurrent detection (even for bipolar devices, or IGBTs). Hard-short circuitry with a steep current slope is handled from one DESAT filter time/voltage threshold setting. In a typical case low load inductance, fast desaturation and high overload (DC-Link voltage multiplied by the short circuit current) requires a short reaction time of the driver thus requiring a short DESAT filter time and relatively high detection voltage. A soft overload (overcurrent) with a slow current rise is handled from the other DESAT filter time/ voltage threshold setting. In another typical case high load inductance, a slow current rise, a slowly increasing overload (slightly increasing saturation voltage times up to a short circuit current) allows for a longer filter time and a lower detection voltage.

Having an internal filter also enables an implementation that has an adjustable DESAT detector (software adjustable) for which parameters (detection voltage and filter time) can be changed without changing the external circuitry. This feature enables late design changes without a corresponding hardware population change. The adjustable filter may be of an analog or digital solution. Adjustability is not specifically required, and fixed values can be used as well.

An internal filter also enables the possibility of using different filter algorithms or filter orders optimized for each detection case, e.g. for equal distributed noise floor an up/down counter can be used, and for fastest reaction an up/reset counter can be used. Other algorithms can also be used to provide other features and functions. Different filter types that can be used according to embodiments can include, but are not limited to passive or active; analog or digital; high-pass, low-pass, band-pass, band-stop, or all-pass; discrete-time or continuous-time; linear or non-linear; or infinite impulse response or finite impulse response. Filter types can be classified in numerous other ways by those skilled in the art including by transfer function, filter topology, hardware filter technology, and in many other ways.

Due to the absence of a time determinant filter capacitor, faster and more reliable short circuit detection time is possible, with no limitation due to the minimum external filter capacitance value. With state of the art implementation the useful minimum filter capacitor is limited by bedewing, noise suppression and layout capacitance. Newer switches with shorter short circuit time specification can be protected (e.g. new IGBT generations and SiC MOSFETs).

Other implementations other than those shown in FIG. 5A can also be used. For example, instead of adjustable comparator a voltage measured at the DESAT pin is measured with a fast analog-to-digital converter ("ADC") and a digital filter is applied afterwards.

Figure 5B:
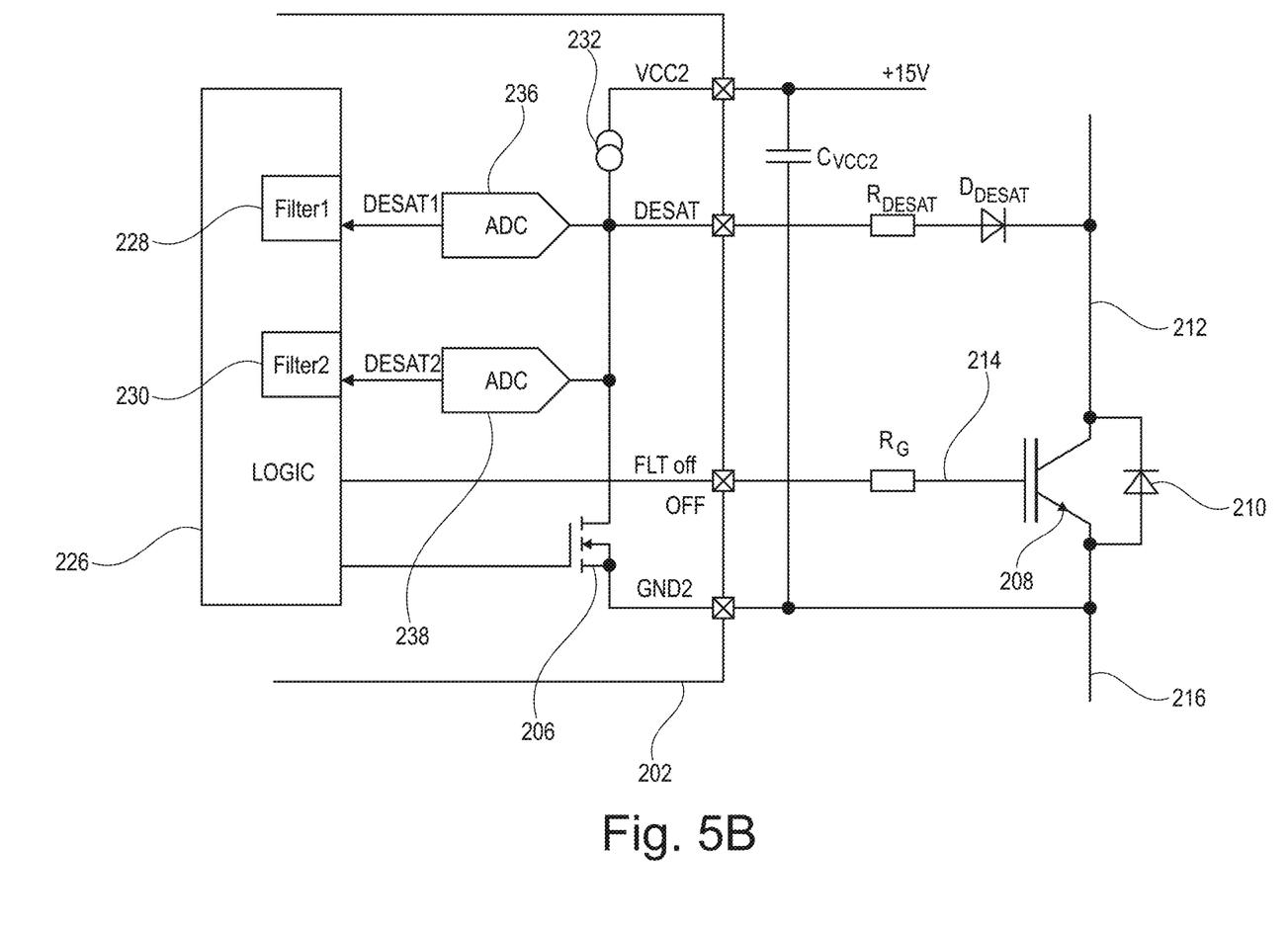

FIG. 5B thus shows an implementation using two ADCs 236 and 238 having an analog input coupled to the DESAT pin. The digital output of ADC 236 designated DESAT1 is coupled to the input of the first filter 228. The digital output of ADC 238 designated DESAT2 is coupled to the input of the second filter 230o. The threshold can be a digital numerical comparison of the ADC word or the word after a filter. The filter can be placed after the ADC before a numerical comparison or after the numerical comparison. The comparison level is programmable by changing the word that the ADC or filter word should be compared to. If the comparison is done before the filter, the filter is done on a one bit data stream. If the filter is done before the comparison the filter is a numerical filter such as a classical low pass filter.

Configuring the threshold by the customer is only one option. It is as well possible to preconfigure a driver to the most relevant used cases and sell as one completely integrated part which reacts on different failure cases.

With an independent usage of an additional DESAT threshold/filter time combination, previously undetectable overcurrent failures can be detected. The additional DESAT detector results (herein described as DESAT2) can be used in various different ways compared to the traditional DESAT detection that turns off the driven switch when a desaturation is detected (herein described as DESAT1). More than one DESAT detector can be used for slow and fast short circuit detection, according to embodiments.

According to embodiments of the invention, any of the above described DESAT detection methods can be used, for example external filtering without sharing the blocking element or internal filtering where sharing of the blocking element can be used, high voltage diode blocking or voltage divider and clamping diode.

Application design-in margin testing is one application for an embodiment of the present invention and provides design-in support to test the margin of the first DESAT in the system against false triggering simultaneously to the evaluation process. The first DESAT detector setting (DESAT1) protects against standard DESAT events as previously described. The second/additional DESAT detector (DESAT2) reviews the setting of the first DESAT in the system with a reasonable design margin during an application evaluation process. The DESAT2 thresholds and timings are adjusted with a margin compared to the first DESAT values (e.g. DESAT1 9V threshold and 5 s filter time, DESAT2 7V threshold and/or 3 µs filter time). DESAT2 is configured in a way that a DESAT2 event's does not lead to a fault turn off. DESAT2 is configured to count DESAT2 events in a DESAT2 counter. The counter value can be monitored by the controller without stopping and endangering the system. The counter value together with the set margin of the thresholds gives an indication for system stability.

For example, one indication of system stability related to voltage threshold is described below. The DESAT1 value is chosen to be, for example, 9 volts. Then DESAT2 is set to a low value to start with, for example 7 volts. If there is a DESAT2 triggered even during the running of the application, then it is known that the margin is smaller than (9 volts-7 volts)/(9 volts)=22.2%. If the DESAT2 value is increased to 7.5 volts and DESAT2 is not triggered during application testing then the margin is between 22.2% and (9 volts-7.5 volts)/(9 volts)=16.7%. Of course, the number of triggering DESAT2 events gives an indication of how close or far away the DESAT2 level is from the real margin value. If the margin is judged to be too high then the DESAT1 level can be potentially reduced. If the margin is judged to be too low then the DESAT1 level can be increased. Filter time can be tested and adjusted in a similar manner as described above.

Figure 6:
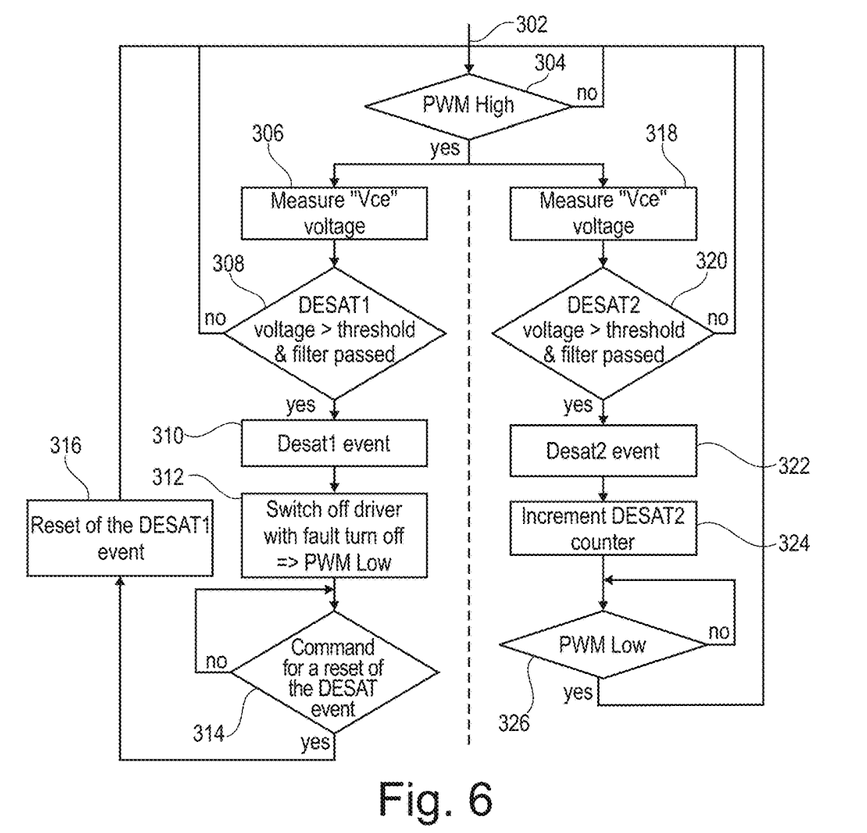
FIG. 6 is a flow diagram of a first DESAT detection and filtering method according to an embodiment of the invention.

A flow diagram of a margin test method is shown in FIG. 6. The flow diagram for the margin test according to an embodiment of the present invention begins at 302. Step 304 interrogates whether or not the PWM signal used in the switch is high or not. If no, the method returns to 302. If yes, in the DESAT1 path described above, the $V_{CE}$ voltage is measured at 306. At 308 the method determines whether or not the DESAT1 voltage is great than the DESAT1 threshold, and whether or not a signal is present at the output of the first filter. If yes, than a DESAT1 event is determined to have happened at 310. If no, than the method returns to 302. If a DESAT1 event has happened, then the switch is turned off and the PWM signal is set low at 312. At 314, the method waits for a command to reset the DESAT event. Once given, the method continues to 316, where the DESAT1 event is reset, and the method further continues back to 302. Recall that step 304 interrogates whether or not the PWM signal used in the switch is high or not. If yes, simultaneously in the DESAT2 path described above, the $V_{CE}$ voltage is measured at 318. At 320 the method determines whether or not the DESAT2 voltage is great than the DESAT2 threshold, and whether or not a signal is present at the output of the second filter. If yes, than a DESAT2 event is determined to have happened at 322. If no, than the method returns to 302. If a DESAT2 event has happened, then the DESAT2 counter is incremented at 324. At 326, the method waits for the PWM signal to be set low, and the method further continues back to 302 when the PWM signal is in fact set low.

Another application of an embodiment of the invention is short circuit detection during repetitive short pulse operation (e.g. sinusoidal pulse width modulation). Reacting on short PWM ON pulses with repetitive DESAT events (e.g. sinusoidal pulse width modulation), standard DESAT minimal filter time is limited due to noise in the system. PWM ON pulses shorter than minimal filter time cannot be detected, and otherwise false triggering of a DESAT event can happen. Short short-circuit events typically do not destroy the switch immediate by current destruction, but the switch is heated up during short circuit events. If a switch has a total short circuit rating of 1ops, this means that the switch is destroyed after 1ops with a nominal short circuit current. A short circuit event that is shorter than 1ops heats up the switch, but does not destroy the switch. For example, 10×1 µs short circuit events can have a similar thermal impact as one 1ops short circuit event. If the driver detects ten consecutive short circuit events it can switch off the switch before destruction. This means not every detected DESAT event requires a driver switch off, but the driver can be made to count a certain number of short repetitive DESAT events until the switch reaches the maximum junction temperature. Counter overflow by noise is prevented by decrementing of the counter with N PWM pulses, according to an embodiment of the invention.

Standard DESAT1 detection uses a certain known filter length. At one side the filter has to be as short as possible to protect for small pulses, at the other side it has to protect against false triggering. Every detected DESAT1 event leads to a fault turn off. Pulses shorter than minimal filter time cannot be detected (e.g. DESAT1 9V threshold and 5 µs filter time). For a second/additional DESAT set up (here called DESAT2) other rules can be applied. For example, not every detected DESAT2 event leads to a fault turn off. Shorter filter time than DESAT1 can be used (e.g. 9V threshold and 3 s filter time). To prevent false triggering, a second higher level filtering is added. Counting of DESAT2 events and counter decrement after N-PWM pulses without DESAT events (e.g. 4, not effective in FIG. 7, no decrement due to max count of 2). After a maximal number of DESAT2 events the driver will switch off with fault turn off (e.g. 2) In addition DESAT2 can be configured as warning only, this means no fault off is initiated, the system controller can read out the warning bits regularly An example of corresponding waveforms can be seen in the timing diagram of FIG. 7 and a corresponding flow diagram can be seen in FIG. 8. If DESAT2 is configured to set a warning only then the path from the (DESAT2 counter=Max DESAT2 events) to the fault turn off will no longer be there and the path should go to a block setting a warning flag instead. FIG. 8 is described in further detail below.

Figure 7:
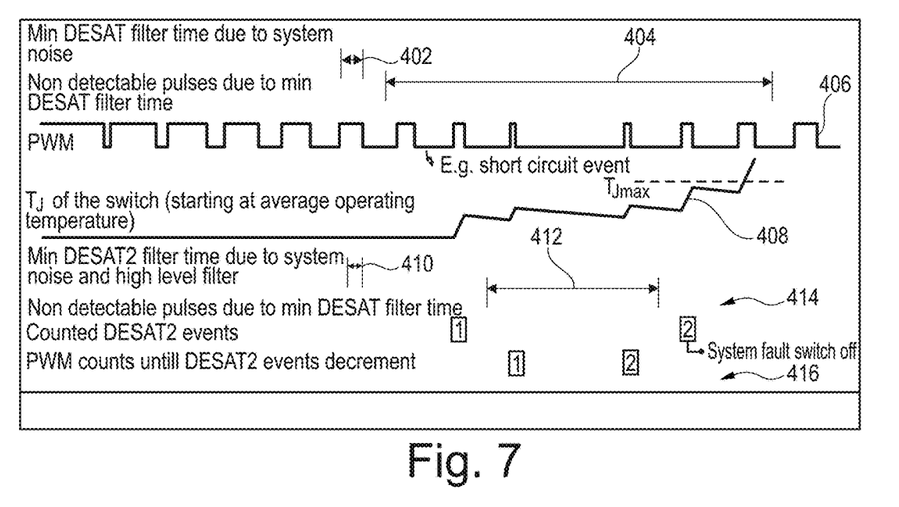
FIG. 7 is a timing diagram associated with the DESAT detection and filtering implementation of FIG. 5 according to an embodiment of the invention.
Figure 8:
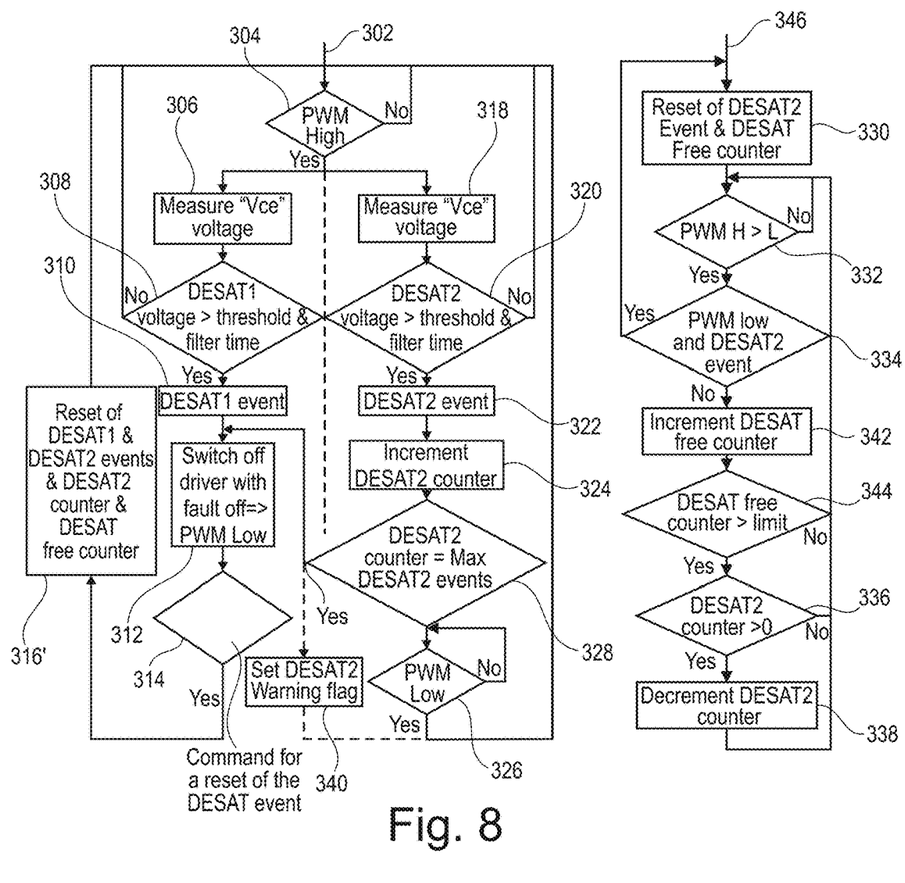
FIG. 8 is a flow diagram of a second DESAT detection and filtering method according to an embodiment of the invention.

Referring now to FIG. 7, a minimum DESAT1 filter time 402 is shown determined by system noise. Non-detectable pulses occurring during time period 404 associated with the PWM waveform 406 are shown. Six such non-detectable pulses are shown during time period 404, since these pulses have a pulse width smaller than the DESAT1 filter time. Nonetheless, the operating temperature 408, TJ, of the switch is shown to be increasing during time period 404 after the point in time when the short circuit occurs. A minimum DESAT2 filter time 410 is shown that is smaller than the filter time 402 of the DESAT1 filter time. During time period 404 two DESAT2 short circuit events are determined, and are shown as counted DESAT2 events 414. During time period 412, also associated with PWM waveform 406, two PWM counts 416 occur associated with non-detectable short circuit events (by either the DESAT1 or DESAT2 filter).

The short circuit detection method according to an embodiment is further explained with reference to the flow diagram of FIG. 8. Note that the DESAT1 and DESAT2 paths are substantially the same as previously described with respect to the margin testing method described above with respect to FIG. 6. However, the DESAT2 path includes a further step 328 that interrogates whether or not the DESAT2 counter has reached a maximum number of DESAT2 events. If yes, then the method proceeds to 312 in the DESAT1 path as previously described. If no, then the method continues to 326 in the DESAT2 path as previously described. A parallel monitoring path is used to decrement the DESAT2 counter for sub-DESAT2 short circuit events. Step 330 is associated with a reset of the DESAT2 event. At start up all counters and events are in reset and the left process of FIG. 8 is entered at 302 and the right process of FIG. 8 is entered at 346. The clearing of the DESAT2 event is accomplished by the right process. In the case where the PWM signal goes low and a DESAT2 event has happened, the event is reset. The left and the right processes depicted in FIG. 8 can be implemented, for example, by two processers functioning in parallel. Step 332 checks to see that the PWM signal has been set low. Step 334 interrogates whether or not the PWM signal is low and whether or not there is a DESAT2 event. It should be noted that when there is a signal after the comparator and filter signaling a DESAT2 event, this is registered in the DESAT2 event register or flip-flop and this is the value from which one can determine that a DESAT2 event has happened. Returning to FIG. 8, if yes, the method returns to 330, and, if not, the method continues to 342. Step 342 increments a DESAT free counter. The method then continues to step 344, which interrogates whether or not the DESAT free counter has reached a predetermined limit or not. If no, the method returns to 332. If yes, the method continues to step 336. Step 336 interrogates whether or not the DESAT2 counter is greater than zero. If not, the method returns to 332. If yes, then the DESAT2 counter is decremented at 338, and the method returns to 332.

A third application of an embodiment of the invention is detecting overcurrent events during a two-level turn-off phase. In cases where the switch current is too high, it may be impossible to turn off the power switch immediately without risking damage or destruction of the switching device. Therefore, the gate voltage of the power switch is first reduced to a defined level (plateau) and the switch is turned off after a certain time (plateau time) has elapsed. This mechanism is called "two-level turn off" (2LTO or TLTOff). In some embodiments, two-level turn off methods may be applied to driving IGBT switches in order avoid latch-up of the switching transistor under high current conditions.

Figure 9:
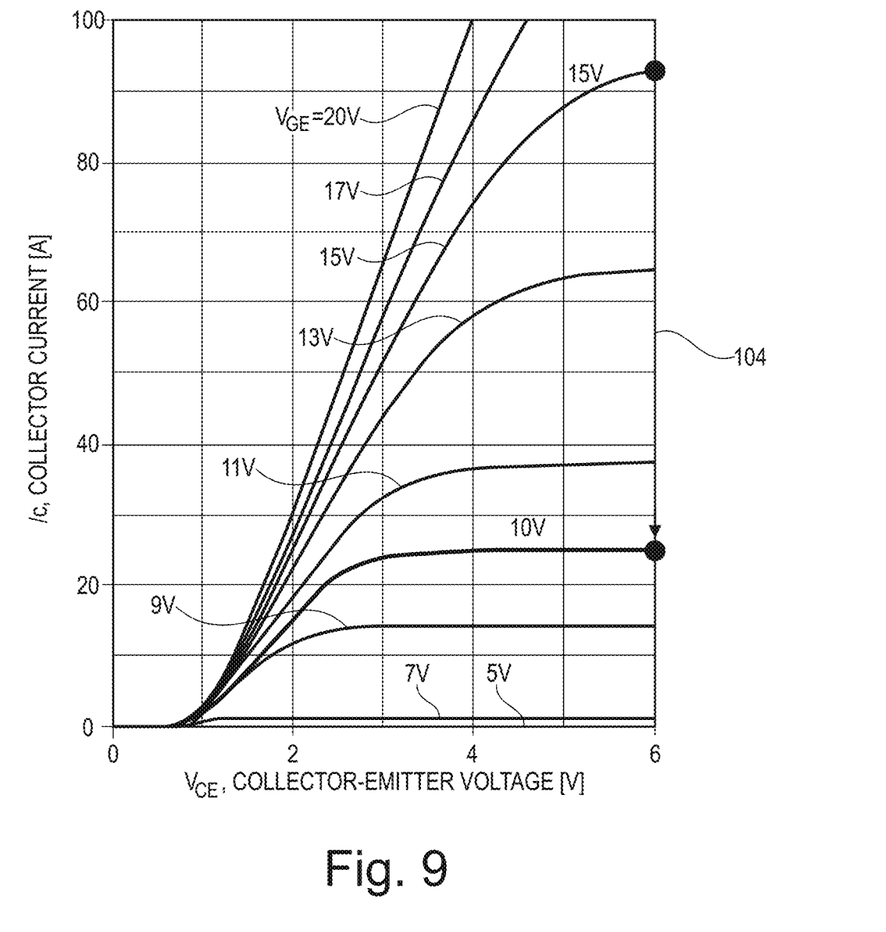
FIG. 9 is a plot of output characteristics of an IGBT switch showing a reduction in the desaturation current by a factor of four according to an embodiment of the invention.

Standard DESAT detection is inactive during two-level turn-off (TLTOff) due to several reasons. The normal DESAT filter time is in most cases longer than a TLTOff plateau time and therefore not able to detect a desaturation during that time, but it is also not desirable to turn off every time the IGBT goes in to desaturation during the TLTOff. In order to prevent the normal DESAT detection from reacting to a desaturation during the TLTOff event either the input or output of the comparator is blocked during the TLTOff plateau time. Standard DESAT1 detection uses a certain filter length and voltage threshold. And at detection, a fault off is executed. During the TLTOff plateau the output of the DESAT1 comparator is blocked. During the TLTOff the IGBT may go in to an overload condition leading to a desaturation due to the reduced gate voltage. This means the desaturation current is roughly reduced by factor of 4 by reducing the gate voltage from 15V to 10V. See the corresponding voltage decrement 104 in the switch operating characteristics of FIG. 9. DESAT events during TLTOff does not lead to an immediate destruction (compared to nominal short circuit the maximum collector current is much lower (e.g. 4×) and therefore the short circuit withstand time is enlarged (e.g. 4×)). A thermal destruction of the IGBT over several PWM cycles is the typical failure case. To protect the switch against this overload scenario, the same measures as explained above with reference to the repetitive short circuit condition can be taken. Not every detected DESAT2 event leads to a fault turn off. A shorter filter time than DESAT1 can be used (e.g. 9V threshold and 2 µs filter time). To prevent false triggering, a second high level filtering added. Counting of DESAT2 events and a counter decrement after N-PWM pulses without DESAT events (e.g. 4) is used. After a maximal number of DESAT2 events the driver will switch off with fault turn off (e.g. 2). In addition DESAT2 can be configured as a warning only. This means no fault off is initiated, and the system controller can read out the warning bits regularly.

Referring now again, to the flow diagram of FIG. 8, if DESAT2 is configured to set a warning only then the path from step 328 (DESAT2 counter=Max DESAT2 events) to the fault turn off 312 will no longer occur, and the path should instead go to an optional block 340 setting a warning flag instead.

The first event overcurrent signal is typically a single event signal due to a single pulse overcurrent condition, but the first event overcurrent signal could also include a response to a double or multiple pulse event, or any other overcurrent event, in an embodiment. The multiple event overcurrent signal may be used as a warning signal or flag or to generate a warning signal or flag, or may be used to directly or indirectly switch off the power switch in an embodiment. Thus, the term "overcurrent signal" as used herein is defined as the detection of an overcurrent condition. Action taken once the overcurrent signal has been generated thus might directly or indirectly result in a switch-off of the power switch, a warning signal for advising a system including the power switch, or any other measures that are deemed appropriate in a particular operating environment. The detection thresholds described herein may be equal to or different from each other in embodiments. Likewise, the time constants described herein may be equal to or different from each other in embodiments. Specific voltage values and time durations can be changed as required for a specific application.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As just one example, while first and second detectors and first and second filters have been shown and described, any number of detectors and filters can be used. As another example, any voltage, time, or any other constants are only for the purpose of illustration and can of course be changed as required for a specific application. The flow charts are provided for illustration only and fewer or more blocks could be used in the illustrated methods of operation. Additional methods of operation are also possible. It is therefore intended that the appended claims encompass any such modifications or embodiments.

What is claimed is:

1. A circuit comprising:
   a plurality of detectors coupled to a first node, wherein a first detector of the plurality of detectors has a first programmable detection threshold, and a second detector of the plurality of detectors has a second programmable detection threshold;
   a plurality of filters coupled to the plurality of detectors, wherein a first filter of the plurality of filters has a first programmable time constant, and a second filter of the plurality of filters has a second programmable time constant; and
   a logic circuit having an input coupled to the plurality of filters and an output coupled to a second node, wherein the first detector of the plurality of detectors is configured to provide a first event overcurrent signal and at least the second detector of the plurality of detectors is configured to provide a multiple event overcurrent signal after counting a plurality of overcurrent events.

2. The circuit system of claim 1, wherein the first detector has a first detection threshold, and the second detector has a second detection threshold different from the first detection threshold.

3. The circuit of claim 1, wherein the first filter has a first time constant, and the second filter has a second time constant different from the first time constant.

4. The circuit of claim 1, wherein the first detector has a first detection threshold, and the second detector has a second detection threshold different from the first detection threshold and wherein the first filter has a first time constant, and the second filter has a second time constant equal to the first time constant.

5. The circuit of claim 1, wherein the first detector has a first detection threshold, and the second detector has a second detection threshold equal to the first detection threshold and wherein the first filter has a first time constant, and the second filter has a second time constant different from the first time constant.

6. The circuit of claim 1, wherein the second detector is configured to provide margin testing of a performance criterion of the first detector.

7. The circuit of claim 1, wherein the first and second detectors are configured to provide an overcurrent signal during a two-level turnoff plateau operating mode of the circuit.

8. The circuit of claim 1, wherein the second node is coupled to a switch.

9. The circuit of claim 1, wherein at least one of the first and second detectors comprises a comparator coupled to a DAC.

10. The circuit of claim 1, wherein at least one of the first and second detectors comprises an ADC.

11. The circuit of claim 1, wherein the first and second filters comprise different filter types.

12. A method comprising:
   detecting an input signal using a first threshold to generate a first detected signal;
   detecting the input signal using a second threshold to generate a second detected signal;
   filtering the first detected signal using a first time constant to generate a first filtered signal;
   filtering the second detected signal using a second time constant to generate a second filtered signal;

using the first filtered signal to generate a first event overcurrent signal;

using at least the second filtered signal to generate a multiple event overcurrent signal; and counting a plurality of overcurrent events associated with the input signal before generating the multiple event overcurrent signal.

13. The method of claim 12, further comprising controlling an operating mode of a switch using the multiple event overcurrent signal.

14. The method of claim 12, further comprising counting a plurality of overcurrent events associated with the input signal before generating a warning signal.

15. The method of claim 12, wherein filtering the first detected signal comprises filtering the first detected signal with a first filtering method, and wherein filtering the second detected signal comprises filtering the second detected signal with a second filtering method.

16. The method of claim 12, wherein the method is performed in a switching system.

17. The method of claim 16, further comprising counting a plurality of overcurrent events associated with the input signal to enable margin testing of at least one performance criterion of the switching system.

18. The method of claim 16, wherein the multiple event overcurrent signal or a warning signal is generated during a two-level turn-off plateau operating mode of the switching system.

19. The method of claim 12, further comprising:

detecting the input signal using a plurality of thresholds to generate a plurality of detected signals; and filtering the plurality of detected signals using a plurality of time constants to generate a plurality of filtered signals.

20. The method of claim 12, wherein at least one of the first threshold, second threshold, first time constant, and second time constant are programmable.

21. A method comprising:

detecting an input signal using a first threshold to generate a first detected signal;

detecting the input signal using a second threshold to generate a second detected signal;

filtering the first detected signal using a first time constant to generate a first filtered signal;

filtering the second detected signal using a second time constant to generate a second filtered signal;

using the first filtered signal to generate a first event overcurrent signal; and using at least the second filtered signal to generate a warning signal, wherein the first threshold and the second threshold are equal and the first time constant and the second time constant are different.

22. A system comprising:

a control circuit having a plurality of detectors coupled to a first node of the control circuit, a plurality of filters coupled to the plurality of detectors, and a logic circuit coupled to the at least first and second filters;

a diode circuit having a first node coupled to the first node of the control circuit; and a switch having a first current node coupled to a second node of the diode circuit, a gate coupled to a second node of the control circuit, and a second current node coupled to a third node of the control circuit, wherein a first detector of the plurality of detectors is configured to provide a first event overcurrent signal and at least a second detector of the plurality of detectors is configured to provide a multiple event overcurrent signal, and wherein the first detector has a first detection threshold, and the second detector has a second detection threshold equal to the first detection threshold and wherein the first filter has a first time constant, and the second filter has a second time constant different from the first time constant.

* * * * *